United States Patent [19]

Dobrovolny

[11] 4,152,653
[45] May 1, 1979

[54] INTEGRATED MIXER ARRANGEMENT

[75] Inventor: Pierre Dobrovolny, North Riverside, Ill.

[73] Assignee: Zenith Radio Corporation, Glenview, Ill.

[21] Appl. No.: 883,086

[22] Filed: Mar. 3, 1978

[51] Int. Cl.² .......................... H04B 1/26; H03H 7/42
[52] U.S. Cl. .................................. 325/446; 325/449; 333/26; 333/238
[58] Field of Search ............... 325/446, 442, 445, 449, 325/450; 333/4, 25, 26, 84 M; 363/158, 159

[56] References Cited

U.S. PATENT DOCUMENTS 3,327,220  6/1977  Podell ................................... 325/446
4,063,176  12/1977 Milligan ................................ 325/449

OTHER PUBLICATIONS

Printed Ckt. Balanced Mixer Design and Applications, Application Note 965, Hewlett Packard, 6/75.

Primary Examiner—Robert L. Griffin
Assistant Examiner—Tommy P. Chin
Attorney, Agent, or Firm—Nicholas A. Camasto

[57] ABSTRACT

A single balanced mixer for use with a superheterodyne receiver or the like comprises an integrated structure characterized by a pair of opposed capacitive plates, a first mixing diode connected between the plates and a second mixing diode connected between one of the plates and a point of ground potential. A ferrite balun core is disposed between the capacitive plates and includes a first cavity receiving the first diode and a return conductor connected between two points of ground potential and a second cavity receiving the second diode and a return conductor connected between one of the plates and a point of ground potential. In another embodiment of the invention, a double balanced mixer comprises two interconnected integrated structures of the foregoing type, the diodes of one of the structures being connected having a polarity opposite that of the other.

14 Claims, 3 Drawing Figures

INTEGRATED MIXER ARRANGEMENT

BACKGROUND OF THE INVENTION

The present invention relates to mixers for superheterodyne communication receivers such as television receivers. More particularly, the invention relates to an improved integrated mixer simultaneously exhibiting, over a relatively wide band of frequencies, a low conversion loss and a high signal handling capability.

It is known that conventional superheterodyne communication receivers require a stage which converts or translates an input signal frequency to an intermediate frequency for subsequent processing by the receiver. For example, in a television receiver a local oscillator signal is combined with the received RF television signal in a mixer stage to produce the intermediate frequency (IF) signal which is coupled to the IF section of the receiver. Typically, a single ended diode mixer is used for this purpose. In such a device both the local oscillator signal and the received RF television signal are injected into a single port comprising one or both terminals of a diode. In addition the resulting IF signal is also developed at this single port. The three signals developed at the port are normally decoupled from each other by means of suitable filter circuits connected between the port and the source of the local oscillator signal and the received RF signal as well as the IF signal utilization apparatus. Although mixers of the foregoing type have been traditionally used in television receivers, their performance from both conversion loss and RF signal handling capability viewpoints is considered to be rather poor. In other words, single ended diode mixers of this type provide only minimal rejection of distortion products produced by the mixer.

The single balanced mixer was devised in an effort to overcome some of the problems characterizing single ended diode mixers. An exemplary prior art single balanced mixer is shown in Hewlett Packard Application Note 965 and comprises a two port device, one port constituting the input of a balanced transformer whose secondary winding includes a center tap connected to ground potential. The local oscillator signal is injected through one port comprising the primary winding of the balanced transformer while the RF signal is injected and the IF signal obtained at the second port comprising the junction between two mixing diodes connected across the secondary winding. As in the case of the single ended diode mixer, suitable filter circuits are required to decouple the RF and IF signals. Although the single balanced mixer is characterized by increased distortion product rejection, it nevertheless exhibits a relatively high conversion loss and low RF signal handling capabilities.

The double balanced mixer evinces a prior art attempt to further improve on the performance of the single ended diode mixer. A double balanced mixer, also shown in the foregoing application note, comprises three ports and is characterized by the use of first and second balanced transformers. Four diodes are normally connected between the two secondary windings of the transformers, the secondary winding of the first transformer having a center tap connected to a ground potential. The local oscillator signal is injected into one port constituting the primary winding of the first transformer while the RF signal is injected at a second port constituting the primary winding of the second transformer. The IF signal is developed at a third port comprising a center tap connected to the secondary winding of the second transformer. While providing improved RF/IF decoupling and also achieving increased distortion product rejection, the conversion loss and RF signal handling capabilities characterizing prior art double balanced mixer are not significantly improved over those of the single balanced mixer.

It is therefore the primary object of the present invention to provide a novel mixer arrangement simultaneously exhibiting a relatively low, wide band conversion loss and a high RF signal handling capability.

It is a further object of the invention to provide an improved mixer having the foregoing attributes and also being conveniently manufacturable at a low cost.

SUMMARY OF THE INVENTION

In accordance with these and other useful objects a single balanced mixer constructed according to the invention comprises a pair of opposed metallic surfaces defining in cooperation with a dielectric and a surface of ground potential a pair of capacitive input/output ports. A first mixing diode is coupled between the two capacitive ports and a second mixing diode is coupled between one of the ports and a point on the surface of ground potential, the diodes being connected for concurrent conduction and non-conduction in response to the injection of an input signal at one of the ports. A first return means is disposed along side the first diode and coupled between two points on the surface of ground potential while a second return means is disposed along side the second diode and coupled between one of the capacitive ports and a point on the surface of ground potential. The first diode and first return means are encompassed by the first portion of a ferrite structure while the second diode and second return means are encompassed by a second portion of the ferrite structure, the ferrite structure extending substantially entirely between the two capacitive ports. A double balanced mixer embodiment of the invention comprises two interconnected sections, each section being substantially identical to that constituting the single balanced mixer embodiment.

DESCRIPTION OF THE PREFERRED EMBODIMENT

Figure 1:
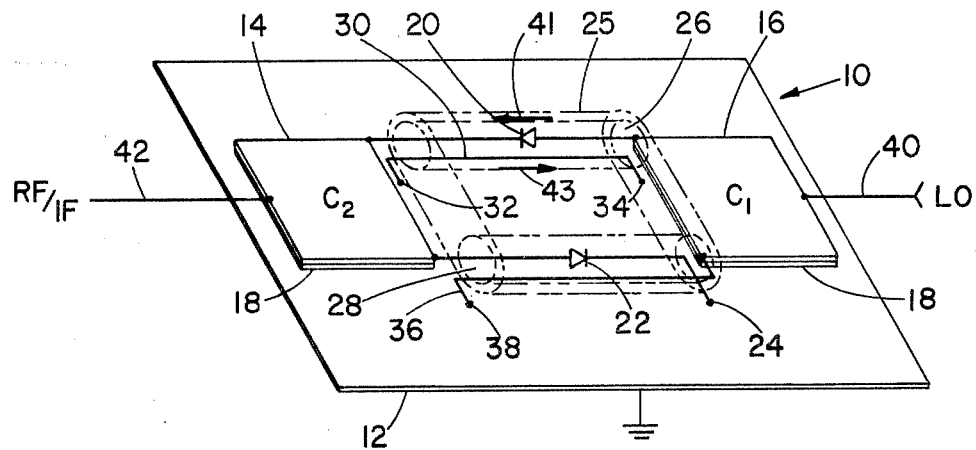
FIG. 1 schematically illustrates a single balanced embodiment of the mixer arrangement of the present invention.

Referring now to FIG. 1, a single balanced mixer constructed according to the present invention is generally illustrated at 10 in the drawing. As shown, mixer 10 comprises a metallic ground plane 12 surmounted by a pair of metallic plates 14 and 16. Plates 14 and 16 constitute with ground plane 12, and a suitable dielectric material 18 disposed between the plates, a pair of capacitors represented by $C_1$ and $C_2$. A first mixing diode 20 is directly coupled between opposed inwardly facing upper corners of plates 14 and 16, the cathode of diode 20 being connected to plate 14 and its anode being connected to plate 16. A second mixing diode 22 has its anode directly connected to a lower inwardly facing corner of plate 14 and its cathode to a point 24 on ground plane 12 in the vicinity of plate 16. A ferrite balun core 25 is disposed overlying ground plane 12 and extending substantially between the inwardly facing edges of capacitor plates 14 and 16. Alternatively, balun core 25 could be seated within a suitable slot or aperture formed in the central area of ground plane 12. Balun core 25 includes a pair of longitudinally extending cavities 26 and 28, mixing diode 20 being disposed within cavity 26 and mixing diode 22 being disposed within cavity 28. Cavity 26 of ferrite balun core 25 also receives a return wire 30 which extends within the cavity along side mixing diode 20 from a point 32 connected to ground plane 12 near capacitor plate 14 to a point 34 connected to ground plane 12 near capacitor plate 16. A second return wire 36 extends within cavity 28 of ferrite balun core 25 along side mixing diode 22 from a point 38 connected to ground plane 12 near capacitor plate 14 to a lower inwardly facing corner of capacitor plate 16. While in the foregoing description the ferrite medium has been characterized as a balun core having two cavities other ferrite configurations could be employed with equally beneficial results. For example, a pair of ferrite beads each having an associated cavity could be used in lieu of the single balun core and its two cavities. In either event, it will be recognized that the construction of mixer 10 is extremely compact and utilizes virtually no connecting wires and can thus be considered an "integrated" single balanced mixer. The result of this construction is to largely reduce stray inductances and capacitances which degrade mixer performance and, in particular, the mixer's wide-band conversion loss characteristics. In other words, the integration of ferrite balun core 25 and mixing diodes 20 and 22 into a single compact package provides for improved mixer performance over other prior art single balanced mixers.

Figure 2:
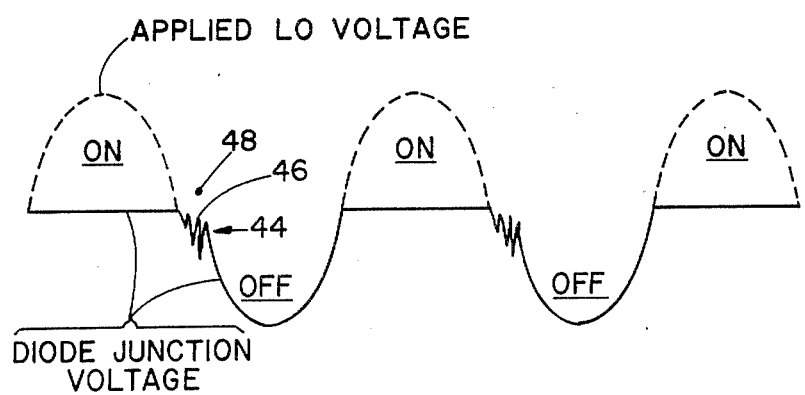
FIG. 2 graphically depicts a waveform pertinent to the operation of the mixer arrangement illustrated in FIG. 1.

As is well known in the art, in high level mixers it is generally desirable to control the states of mixing diodes 20 and 22 solely in response to the injected local oscillator signal which is coupled to capacitive plate 16 by a conductor 40. To this end, system parameters are normally adjusted such that the amplitude of the injected local oscillator signal is considerably greater than the amplitude of the RF signal coupled to capacitive plate 14 by a conductor 42, the resultant IF signal also being developed at conductor 42. Thus, considering the effect of the injected local oscillator voltage on mixing diodes 20 and 22, it will initially be observed that when capacitor plate 16 is of negative polarity relative to ground plane 12 both mixing diodes 20 and 22 are non-conductive. This condition is illustrated by the waveform of FIG. 2 wherein it will be seen that the diode junction voltage generally follows the negative alternations of the injected local oscillator voltage. Even though mixing diodes 20 and 22 are nonconductive, due to the difference in potential between capacitive plate 16 and ground plane 12, current is caused to flow in return wire 36 disposed within cavity 28 of ferrite balun core 25. The magnetization of ferrite balun core 25 in response to the flux induced by the unidirectional current flow through cavity 28 causes the core to present a very high impedance to the injected local oscillator voltage applied to return wire 36, which impedance may be represented by a lossy choke connected in series with the return wire. This high impedance serves to decouple capacitor plate 16 from ground plane 12 during the negative alternations of the injected local oscillator voltage for preventing return wire 36 from shunting the local oscillator which would otherwise prevent the development of a voltage on plate 16.

When the injected local oscillator voltage drives capacitor plate 16 to a positive polarity relative to ground plane 12 both mixing diodes 20 and 22 become conductive. Therefore, a current flows from capacitance $C_1$ through mixing diode 20 in the direction indicated by arrow 41 and is then shunted to ground plane 12 by capacitance $C_2$. The magnetization within cavity 26 of ferrite balun core 25 in response to the current flowing through mixing diode 20 induces a current flow in return wire 30 in the opposite direction as indicated by arrow 43. In a similar manner, current flows through mixing diode 22 in one direction and through return wire 36 in the opposite direction. Since, in both cases, current is flowing in opposite directions through cavities 26 and 28 of ferrite balun core 25 there is only a negligible resultant magnetization of the ferrite core. The virtually unmagnetized ferrite core therefore introduces only relatively small impedances into the diode circuits. These small impedances, in conjunction with the small stray impedances resulting from the compact configuration of mixer 10, allow for an improved wide-band conversion loss characteristic over other known devices.

As mentioned previously, for a high level mixer it is desirable that the states of mixing diodes 20 and 22 be determined solely by the injected local oscillator voltage. The voltage developed across the junction of either of the diodes in response to a sinusoidal signal such as the injected local oscillator voltage is illustrated in FIG. 2. In this regard, it will be appreciated that it is frequently preferable to slightly reverse bias the mixing diodes for reducing their conduction time in response to the injected local oscillator voltage although, for purposes of clarity, such condition has been omitted from the waveform of FIG. 2. It will be noted, assuming that the diodes are being driven by a large local oscillator voltage, that during the conductive states of the diodes their junction voltages are relatively small. On the other hand, during the non-conductive states of the diodes their junction voltages generally follow the injected local oscillator voltage except for the occurence of a ringing effect near the beginning of each negative voltage alternation. This ringing effect is manifested by the production of a plurality of voltage spikes indicated generally at 44 which result from the fact that each mixing diode is in effect a resonant circuit having a particular resonance frequency during the diode's non-conductive state. Thus, when the diode is switched from its conductive to non-conductive state by the injected local oscillator voltage, the oscillations characterizing its resonant frequency appear as an exponentially damped high frequency signal superimposed on the local oscillator voltage. As described hereinafter, this ringing effect decreases the diode's RF signal handling capability and increases the generation of undesirable cross-modulation products. Assume, for example, that the RF signal developed at capacitor plate 14 includes an instantaneous component having a signal level at point 48 corresponding to the occurrence of a peak 46 of the diode junction voltage. The effect of the instantaneous RF signal level at point 48 is to raise the junction voltage of the diode thereby causing the diode to conduct. Of course, if the amplitude of spike 46 is reduced, a much larger instantaneous RF signal level at point 48 would be required to so affect the diode switching cycle. Since it is undesirable for the diode to conduct during the negative alternation of the injected local oscillator voltage, a technique must be utilized to prevent this problem. One common prior art solution to the problem consists of increasing the internal resistance of the diode to hasten the damping rate of the oscillations. This, however, produces the undesired effect of increasing the diode's conversion loss. Another typical prior art practice employed to overcome the problem is that of reducing the level of the injected RF signal to a point where the resultant of the instantaneous RF signal and the peaks of the oscillation spikes will not drive the diode into conduction. This, of course, also imposes limitations on the use of the mixer.

The present invention partially overcomes the foregoing problems by minimizing the stray impedances characterizing mixer 10. As mentioned previously, the reduced stray impedances result from the integrated configuration characterizing ferrite balun core 25 and mixing diodes 20 and 22. As a result of minimizing the stray impedances of the mixer the resonant frequency of the diode is increased, the increased oscillation frequency being more easily absorbed by the surrounding ferrite medium. In other words, ferrite losses are frequency dependent so that increasing the ringing frequency by reducing stray impedances allows the ferrite medium to more efficiently absorb the ringing oscillations without considerable conversion loss deterioration. In this manner, mixer 10 may be operated at higher level RF signals without increasing the internal resistance of the mixing diodes. Moreover, the conversion loss versus frequency characteristic of the mixer is maintained relatively constant thereby providing further improved mixer performance.

In addition, capacitances $C_1$ and $C_2$ formed by plates 14 and 16, dielectric 18 and ground plane 12 constitute nearly a short circuit for the linear undesired mixer products produced by the mixing action of diodes 20 and 22 but not for the lower frequency IF and RF signals. As a result, the characteristics of a so-called "Y-mixer" are achieved whereby capacitances $C_1$ and $C_2$ are effective for reflecting the linear undesired mixer products back to the mixing diodes for reprocessing and thereby allowing for the recoupment of energy which would otherwise be lost. It will be appreciated that the existance of any stray inductances characterizing mixer 10 and, in particular, capacitances $C_1$ and $C_2$, will tend to detract from or reduce the effectiveness of the short circuits otherwise produced by capacitances $C_1$ and $C_2$ and thusly reduce the efficiency of the reflection action described above. This reduction in reflection efficiency is normally manifested by an increased and somewhat eratic frequency versus conversion loss characteristic. However, due to the integrated configuration of mixer 10 and the use of plates 14 and 16 for forming capacitances $C_1$ and $C_2$, such stray inductances are largely minimized providing for high reflection efficiency with nearly flat conversion loss characteristic. Furthermore, it will of course be appreciated that capacitances $C_1$ and $C_2$ will, in practice, form an integral part of a suitable matching or tuning circuit for injecting and/or developing the appropriate input and output signals as required in a particular mixer application.

Figure 3:
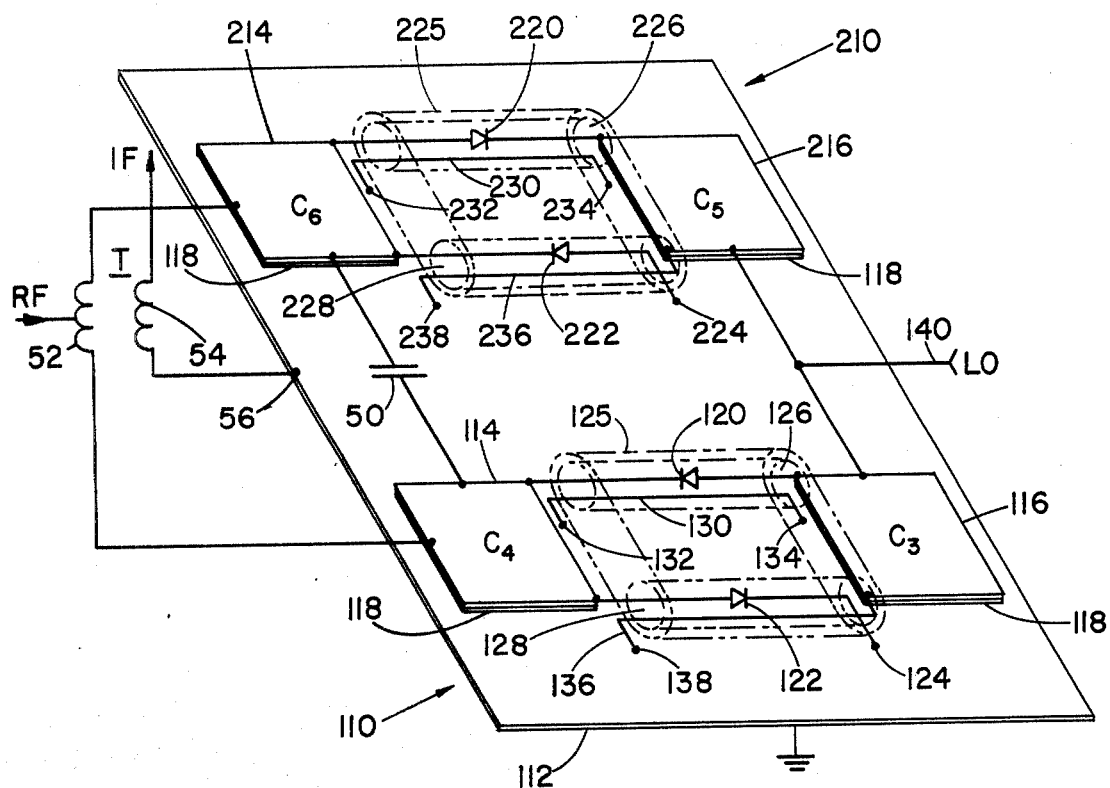
FIG. 3 schematically illustrates a double balanced embodiment of the mixer arrangement of the present invention.

FIG. 3 illustrates a double balanced mixer constructed according to the present invention. It will be recalled that, in general, double balanced mixers provide improved IF/RF decoupling and better cancellation of intermodulation products than single balanced mixers.

It will be observed that the double balanced mixer illustrated in FIG. 3 comprises a first section 110 identical to the single balanced mixer illustrated in FIG. 1 and a second section 210 also identical to the single balanced mixer illustrated in FIG. 1 except that the mixing diodes are of reversed polarity. Thus, section 110 comprises a pair of metallic plates 114 and 116 disposed overlying a ground plane 112. A suitable dielectric material 118 is disposed between plates 114, 116 and ground plane 112 for forming capacitances $C_3$ and $C_4$. A first mixing diode 120 is coupled between upper inwardly facing corners of plates 114 and 116, the cathode of diode 120 being connected to plate 114 and its anode being connected to plate 116. A second mixing diode 122 has its anode connected to the lower inwardly facing corner of plate 114 and its cathode connected to a point 124 on ground plane 112 in the vicinity of the lower inwardly facing corner of plate 116. A return wire 130 is disposed adjacent diode 120 and extends between a pair of points 132 and 134 of ground plane 112. A second return wire 136 is disposed adjacent diode 122 and extends between a point 138 on ground plane 112 and the lower inwardly facing corner of plate 116. Finally, a ferrite balun core 125 having a pair of apertures or cavities 126 and 128 is disposed between plates 114 and 116 such that cavity 126 receives diode 120 and return wire 130 and cavity 128 receives diode 122 and return wire 136.

Section 210 similarly comprises a pair of metallic plates 214 and 216 constituting in association with dielectric 118 and ground plane 112 a pair of capacitances $C_5$ and $C_6$. A first diode 220 extends between opposed inwardly facing corners of plates 214 and 216, the cathode of diode 220 being connected to plate 216 and its anode to plate 214. The cathode of a second diode 222 is connected to plate 214 and its anode to a point 224 on ground plane 112 in the vicinity of the lower inwardly facing corner plate 216. A first return wire 230 extends along side diode 220 between points 232 and 234 on ground plane 112 while a second return wire 236 extends along side diode 222 from a point 238 on ground plane 112 to the lower inwardly facing corner of plate 216. And, as before, a ferrite balun core 225 having apertures or cavities 226 and 228 is disposed overlying ground plane 112 and extending substantially between the inwardly facing edges of capacitor plates 214 and 216. Cavity 226 of balun core 225 receives diode 220 and return wire 230 while cavity 228 similarly receives diode 222 and return wire 236.

In addition to sections 110 and 210 the double balanced mixer illustrated in FIG. 3 includes a conductor 140 for the balanced injection of the local oscillator signal at plates 116 and 216 and a capacitor 50 connected between plates 114 and 214. The RF signal is injected unbalanced at plates 114 and 214 by means of a tap on the primary winding 52 of a transformer T. The IF signal is developed by the secondary winding 54 of transformer T, one end of secondary winding 54 beng connected to ground plane 112 at 56.

As mentioned above, the double balanced mixer illustrated in FIG. 3 comprises two sections 110 and 210 each equivalent to the single balanced mixer of FIG. 1 except for the reversal of diode polarity in section 210. Further more, each of the sections 110 and 210 operate individually in a manner identical to that previously described with respect to the single balanced mixer of FIG. 1 and in combination so as to produce the mixing action resulting from a double balanced mixer.

In particular, during the positive alternations of the injected local oscillator signal both capacitor plates 116 and 216 are driven to a positive voltage relative to ground plane 112. Consequently, diodes 120 and 122 of secion 110 are both conductive while diodes 220 and 222 of section 210 are both nonconductive. During the opposite alternation of the injected local oscillator signal, diodes 220 and 222 of section 210 are both conductive while diodes 120 and 122 of section 110 are both nonconductive. In other words, the diodes comprising sections 110 and 210 of the mixer are alternately conductive and nonconductive for producing the mixing action characteristic of a double balanced mixer. The individual operation of each of the sections 110 and 210 is, of course, identical to that previously described for the single balanced mixer of FIG. 1 and therefore will not be described in detail. The major differences between the circuits reside in the manner of injecting the RF signal and deriving the IF signal. As mentioned previously, the RF signal is injected unbalanced at plates 114 and 214 by means of a tap on primary winding 252 of transformer T. This, along with the alternate conduction of sections 110 and 210 results in the development of symmetrical IF voltages at plates 114 and 214. Capacitor 50 in conjunction with capacitances $C_4$ and $C_6$ form a resonant circuit at the IF frequency for coupling the IF signal to secondary winding 54 of transformer T.

It should be emphasized that all the advantages discussed above with regard to the mixer of FIG. 1 and attendant from the integrated configuration of the mixer and the use of capacitor plates 214 and 216 are equally applicable to the double balanced mixer of FIG. 3. Specifically the mixer is characterized by a relatively low conversion loss characteristic which has a substantially constant value over a wide band of frequencies and which further exhibits a high signal handling capability.

Various modifications can be made to the structure of the double balanced mixer of FIG. 3 without affecting its performance. For example, one balun core could be substituted for the two separate ferrite balun cores 125 and 225. In this case, one cavity of the single balun core would receive both diodes 120 and 220. Also, one return wire would replace return wires 130 and 230 and extend through the cavity with diodes 120 and 220. The second cavity of the single balun core would receive diodes 122 and 222 and a single return wire replacing return wires 130 and 236. A further modification would include merging plates 116 and 118 thereby forming a unitary input capacitance at which the local oscillator signal would be injected.

Thus, while a particular embodiment of the present invention has been shown and described, it will be obvious to those skilled in the art that various changes and modifications may be made without departing from the invention in its broader aspects. The aims in the appended claims is to cover all such changes and modifications as fall within the true spirit and scope of the invention.

What is claimed is:

1. A frequency translation device comprising:
first and second ports;
means forming a surface of ground potential;
a first diode coupled between said first and second ports;
a second diode coupled between said second port and a point on said surface of ground potential;
first return means disposed along side said first diode and coupled between two points on said surface of ground potential;
second return means disposed along side second diode and coupled between said first port and a point on said surface of ground potential; and
magnetically conductive means extending substantially between said first and second ports and having a first portion substantially encompassing said first diode and said first return means and a second portion substantially encompassing said second diode and said second return means.

2. A frequency translation device according to claim 1 wherein said first and second ports comprise first and second capacitive means respectively.

3. A frequency translation device according to claim 2 wherein said first and second capacitive means each comprise a metallic surface and a dielectric surmounting and forming with said surface of ground potential said capacitive means.

4. A frequency translation device according to claim 3 wherein said capacitive means are characterized by a relatively low impedance for at least one frequency band having frequencies above a predetermined frequency.

5. A frequency translation device according to claim 1 wherein said first and second diodes are connected for concurrent conduction and non-conduction in response to the injection of an input signal at said first port.

6. A frequency translation device according to claim 1 wherein said first and second return means comprise return conductors.

7. A frequency translation device according to claim 1 wherein said magnetically conductive means comprises a balun core having first and second cavities, said first cavity receiving said first diode and said first return means and said second cavity receiving said second diode and said second return means.

8. A frequency translation device according to claim 2 including third capacitive means coupled to said second capacitive means, a third diode coupled between said first capacitive means and said third capacitive means, and a fourth diode coupled between said third capacitive means and a point on said surface of ground potential, said first portion of said magnetically conductive means substantially encompassing said first diode, said third diode and said first return means and said second portion of said magnetically conductive means substantially encompassing said second diode, said fourth diode and said second return means.

9. A frequency translation device according to claim 8 wherein said third and fourth diodes are connected for concurrent conduction and non-conduction in response to the injection of an input signal at said first capacitive means and 180° out-of-phase with said first and second diodes.

10. A frequency translation device according to claim 8 wherein said first capacitive means comprises first and second capacitive portions, said first diode being connected to said first capacitive portion and said third diode being connected to said second capacitive portion.

11. A frequency translation device according to claim 10 including third return means disposed along side said third diode and coupled between two points on said surface of ground potential and fourth return means disposed along side said fourth diode and coupled between said second capacitive portion and a point on said surface of ground potential.

12. A frequency translation device according to claim 11 wherein said magnetically conductive means comprises first and second balun cores each having first and second cavities, said first cavity of said first balun core receiving said first diode and said first return means, said second cavity of said first balun core receiving said second diode and said second return means, said first cavity of said second balun core receiving said third diode and said third return means and said second cavity of said second balun core receiving said fourth diode and said fourth return means.

13. A frequency translation device according to claim 10 wherein said third capacitive means and said first and second capacitive portions each comprise a metallic plate and a dielectric surmounting and forming with said surface of ground potential said third capacitive means and said first and second capacitive portions.

14. A frequency translation device according to claim 13 wherein said third capacitive means and said first and second capacitive portions are each characterized by a relatively low impedance for at least one frequency band having at frequencies above a predetermined frequency.

* * * * *